(12) United States Patent
Hente et al.

(10) Patent No.: US 8,502,212 B2
(45) Date of Patent: Aug. 6, 2013

(54) ORGANIC LIGHT EMITTING DIODE SEGMENT

(75) Inventors: Dirk Hente, Wuerselen (DE); Stefan Peter Grabowski, Neuss (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/254,520

(22) PCT Filed: Feb. 25, 2010

(86) PCT No.: PCT/IB2010/050828
§ 371 (c)(1),
(2), (4) Date: Sep. 2, 2011

(87) PCT Pub. No.: WO2010/100585
PCT Pub. Date: Sep. 10, 2010

(65) Prior Publication Data
US 2011/0316012 A1    Dec. 29, 2011

(30) Foreign Application Priority Data
Mar. 5, 2009 (EP) ..................... 09154384

(51) Int. Cl.
*H01L 35/24* (2006.01)
(52) U.S. Cl.
USPC ............... 257/40; 257/98; 257/99; 257/433

(58) Field of Classification Search
USPC .............. 257/88, 12–13, 98–100, 81, 84, 57, 257/66, 69, 72, 431–433, 344, 347, 706, 257/707, 40; 438/22, 48–52; 313/112, 501, 313/503, 506
See application file for complete search history.

(56) References Cited

U.S. PATENT DOCUMENTS

| | | | |
|---|---|---|---|
| 5,757,139 A | 5/1998 | Forrest et al. | |
| 5,834,893 A | 11/1998 | Bulovic et al. | |
| 6,166,489 A * | 12/2000 | Thompson et al. | 313/506 |
| 2006/0214596 A1 | 9/2006 | Miller et al. | |
| 2006/0232992 A1 | 10/2006 | Bertram et al. | |
| 2007/0114522 A1 * | 5/2007 | Kwok et al. | 257/40 |
| 2008/0171141 A1 | 7/2008 | Liu et al. | |

FOREIGN PATENT DOCUMENTS

WO    2005015640 A1    2/2005

* cited by examiner

*Primary Examiner* — Dung A. Le
(74) *Attorney, Agent, or Firm* — Mark L. Beloborodov

(57) ABSTRACT

The invention relates to an organic light emitting diode segment (100) comprising two organic light emitting diodes (102; 104), wherein the organic light emitting diodes are vertically stacked with their conducting directions pointing in opposed directions, wherein in the stack the organic light emitting diodes (102; 104) are electrically connected to each other by a common shared electrode (112).

11 Claims, 8 Drawing Sheets

ORGANIC LIGHT EMITTING DIODE SEGMENT

FIELD OF THE INVENTION

The present invention relates to an organic light emitting diode segment, an organic light emitting diode device, and a method of producing an organic light emitting diode device.

BACKGROUND OF THE INVENTION

Organic light emitting devices (OLEDs) are light emitting devices that use organic electroluminescent materials excited by electric current to emit light. A typical OLED is composed of an emissive layer, a conductive layer, a substrate, an anode and cathode terminals. The emissive layer is made of organic molecules that conduct electricity.

In order to increase the efficiency of large area OLED light sources, segmentation has been introduced which is nowadays a common method to increase the efficiency of such OLED light sources. By segmentation, the illumination area is sub-divided into small segments (strips) that are electrically connected in series. Due to the increased driving voltage the current is decreased for the same electrical power. Since the most dominant losses of an OLED device are related to the current density, the efficiency of the light source is increased. Another advantage of segmentation is the ease of scalability, the size of the OLED area can be changed easily just by changing the number of segments.

In order to permit AC driving of OLEDs, in order to reduce flickering especially for low driving frequencies an anti-parallel connection of different OLED devices is required in order to enable a current flow in both directions.

WO 2005/015640 A1 discloses an organic light emitting device with a circuit arrangement emitting light on both the positive and the negative cycle of an AC driving voltage.

SUMMARY OF THE INVENTION

The present invention provides an organic light emitting diode segment comprising two organic light emitting diodes, wherein the organic light emitting diodes are vertically stacked with their conducting directions pointing in opposed directions, wherein in the stack the organic light emitting diodes are electrically connected to each other by a common shared electrode.

In the following, an 'unshared electrode' is understood as an electrode which is not common shared as one common electrode by two spatially adjacent OLEDs within the vertical stack of a segment. In contrast, a common shared electrode is an electrode which serves the purpose of being used a common single electrode used by two spatially adjacent OLEDs within the vertical stack of a segment, i.e. said two OLEDs share this common electrode.

In other words, the organic light emitting diodes are electrically connected to each other by an electrode which is spatially shared by both diodes. As a consequence, the segment comprises only three electrodes, namely two unshared electrodes on the top and the bottom of the stacked layer arrangement of the segment and one common shared electrode in the 'middle' of the stack. Typically, the stacked organic light emitting diode segment then consists of a substrate on the bottom, followed by the first unshared electrode which may for example comprise ITO (indium tin oxide), an emissive layer, the common shared electrode, a further emissive layer, and the top unshared electrode which also may typically comprise ITO.

Embodiments of the invention have the advantage that two OLEDs can be provided without the need of producing four individual electrodes. The abandonment of one electrode simplifies the production process. Further, due to the stacking of the OLEDs devices can be provided with double light emission efficiency, while due to the presence of only three electrodes the light emission efficiency is increased compared to conventional stacked OLED devices. This is due to the fact that in case of stacking in conventional devices at least three electrodes need to be transparent. However, since 100% transparency will never be achieved, by reducing the number of required transparent electrodes to two by using the common shared electrode the total light emission efficiency is increased—a light attenuation due to the presence of a third electrode is avoided.

In accordance with an embodiment of the invention, the common shared electrode is the cathode. This has the advantage of an easy manufacturability since typically the anode and cathode material need to be different in order to achieve highly efficient OLED devices.

In accordance with a further embodiment of the invention, the two organic light emitting diodes are adapted for light emission in a respective first and second wavelength range, wherein the common shared electrode is optically transparent in at least said first or second wavelength range. As already discussed above, this has the advantage that in one emission direction the accumulated light emission of both, the first and the second OLED can be provided. In case in an embodiment of the invention the first wavelength range is different from the second wavelength range, this allows for a color mixing for dual-colored OLED devices such that no additional diffuser is required which would be necessary in case segments with differently colored OLEDs would be arranged side by side. Additionally, the losses are minimized because only a single cathode interlayer is required and due to the series connections of the first and second OLED.

In another aspect, the invention relates to an organic light emitting diode device comprising a sequence of serially electrically connected organic light emitting diode segments according to the invention, wherein the sequence of segments comprises a given segment and a neighboring segment, wherein the given segment comprises a first and second organic light emitting diode with a first common shared electrode and first and second unshared electrodes, wherein the neighboring segment comprises a third and fourth organic light emitting diode with a second common shared electrode and third and fourth unshared electrodes, wherein the given segment is serially electrically connected to the neighboring segment by an electrical connection of the first common shared electrode with the third unshared electrode and by an electrical connection of the second common shared electrode with the first unshared electrode, wherein any unshared electrode comprised in the sequence of segments is electrically connected to maximally one common shared electrode comprised in the sequence of segments.

The OLED device thus allows a series connection of segments, an anti-parallel connection to allow AC driving and/or color mixing and has a single common cathode metal interlayer. The anti-parallel connection of OLED segments allows AC driving while at the same time stacking with a common cathode reduces flicker for low frequency AC driving and increases the efficiency. Another option is to utilize the anti-parallel connection for dual colored OLED device where the sign of the driving current is corresponding to a single color. By adjusting the mean value of driving current for a positive and/or negative current flow the color of the OLED device can be changed. The color mixing is maximized by vertical stacking of the two color segments so that no additional diffuser is required. Additionally, the losses are minimized, because only a single cathode interlayer is required and due to the series connection of the segments.

In accordance with an embodiment of the invention, the sequence of segments comprises an even number of n segments and a first and a second connecting terminal for receiving electrical power for driving the device for light emission, wherein the sequence of segments comprises a first and a last segment, wherein the first connecting terminal is electrically connected to the common shared electrode of the first segment and the unshared electrode of the last segment, which is unconnected to a common shared electrode, wherein the second connecting terminal is electrically connected to a common shared electrode of any segment of the sequence of the segments.

Preferably, the second connecting terminal is electrically connected to the common shared electrode of the n/2+1st segment of the sequence of segments.

By means of this arrangement an AC driving of the OLED device is possible with flickering for low frequency AC driving being drastically reduced. Further, due to the symmetric arrangement of the OLED segments a uniform light emission area can be provided.

In accordance with an alternative embodiment of the invention the sequence of segments comprises an odd number of segments and a first, second, third and fourth connecting terminal for receiving electrical power for driving the device for light emission, wherein the sequence of segments comprises the first and the last segment, wherein the first connecting terminal is electrically connected to the common shared electrode of the first segment and the second connecting terminal is electrically connected to the unshared electrode of the first segment which is unconnected to a common shared electrode, wherein the third connecting terminal is electrically connected to the common shared electrode of the last segment and a fourth connecting terminal is electrically connected to the unshared electrode of the last segment which is unconnected to the common shared electrode.

Preferably, the common shared electrode of the first segment is electrically connected via a diode to the first connecting terminal and/or the common shared electrode of the last segment is electrically connected via a further diode to the third connecting terminal. In case of AC driving of the device, again this permits a very uniform light emission over the whole device area, i.e. this provides a very uniform radiating surface.

In accordance with an embodiment of the invention, the first and second terminals are identical and/or the third and fourth terminals are identical, which allow to further reduce the production costs.

In another aspect, the invention relates to a method of producing an organic light emitting diode device, the method comprising providing a first layer comprising a first given unshared electrode segment, depositing a first emitter layer on the first layer, depositing a second layer comprising a given common shared electrode segment on the first emitter layer, depositing a second emitter layer on the second layer and depositing a third layer comprising a second given unshared electrode segment on the second emitter layer, wherein the first given unshared electrode segment, the first emitter layer and the given common shared electrode segment form a first organic light emitting diode and wherein the given common shared electrode segment, the second emitter layer and the second given unshared electrode segment form a second organic light emitting diode, wherein the first and second organic light emitting diodes are vertically stacked with their conducting directions pointing in opposed directions.

In accordance with an embodiment of the invention, for producing an organic light emitting diode device comprising a sequence of serially electrically connected organic light emitting diode segments with a sequence of segments comprising a given segment and a neighboring segment, the first layer further comprises a first neighboring unshared electrode segment, the first emitter layer comprises a first gap, the second layer further comprises a neighboring unshared electrode segment, wherein the deposition of the second layer is performed for electrically contacting the first neighboring unshared electrode segment by the given common shared electrode segment via the gap. Further, in this case the second emitter layer comprises a second gap, the third layer further comprises a second neighboring unshared electrode segment, wherein the deposition of the third layer is performed for electrically contacting the neighboring common shared electrode segment by the second given unshared electrode segment via the first gap. The first given unshared electrode segment, the first emitter layer, the given common shared electrode segment, the second emitter layer and the second given unshared electrode segment form the given organic light emitting diode segment and the first neighboring unshared electrode segment, the first emitter layer, the neighboring common shared electrode segment, the second emitter layer and the second neighboring unshared electrode segment form the neighboring organic light emitting diode segment.

BRIEF DESCRIPTION OF THE DRAWINGS

In the following preferred embodiments of the invention are described in greater detail by way of example only making reference to the drawings in which.

DETAILED DESCRIPTION OF EMBODIMENTS

Figure 1:
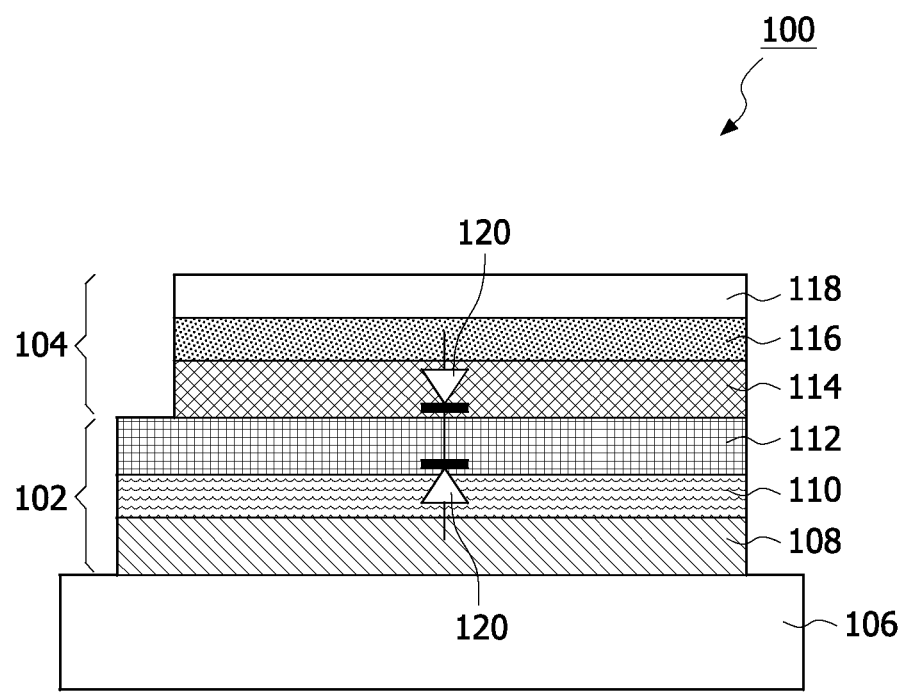
FIG. 1 is a schematic view of an OLED segment.

In the following similar elements are depicted by the same reference numerals.

FIG. 1 is a schematic view of an organic light emitting diode segment 100. The segment comprises two organic light emitting diodes 102 and 104. These organic light emitting diodes are vertically stacked with their conducting directions pointing in opposed directions. This is illustrated in FIG. 1 by the symbol 120 that illustrates diodes which are shown here for illustrative purposes, only. In reality, the diodes 120 are formed by the different layers illustrated in FIG. 1. These layers include a substrate 106, on top of which a first electrode 108, made for example from ITO is deposited. On top of the electrode 108 an emissive layer 110 is located. On top of the emissive layer an electrode 112 is provided. The electrode 108, the emissive layer 110 and the electrode 112 form the first diode 102. The electrode 108 is the anode and the electrode 112 is the cathode.

Regarding the second OLED 104, this OLED is formed by the electrode 112, the emissive layer 114 and the electrode 116. Again, the electrode 116, which is the anode, may for example comprise ITO. On top of the OLED 104 an optional cover layer may be provided.

As can be clearly seen from FIG. 1, the segment comprises a total of three electrodes, namely an unshared electrode 108 of the OLED 102, a common shared electrode 112, which is the cathode for both the OLED 102 and the OLED 104, and an unshared electrode 116 of the OLED 104. This results in two organic light emitting diodes which are vertically stacked with their conducting directions pointing in opposed directions. In FIG. 1, the current conducting direction of the OLED 102 is from bottom to the top and the conducting direction of the OLED 104 is from top to the bottom.

Figure 2:
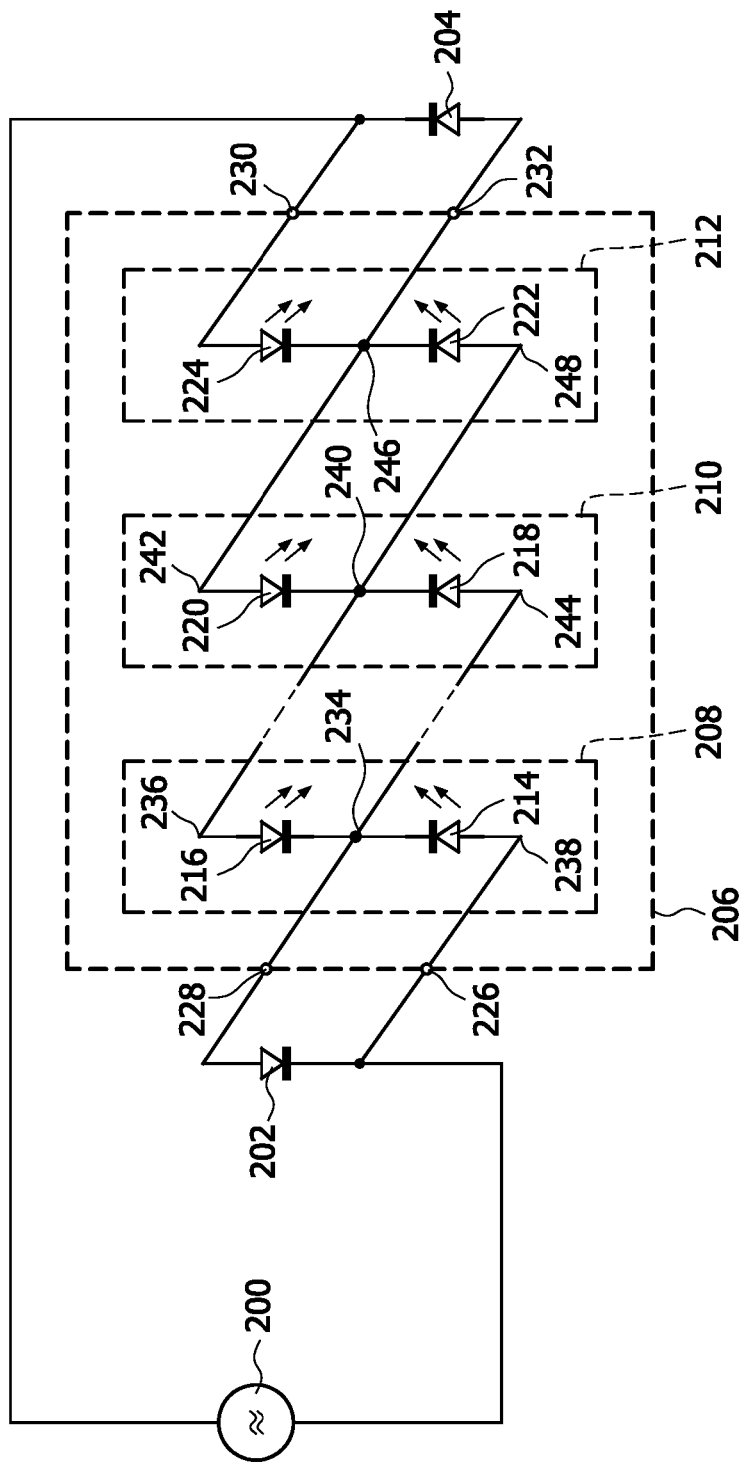
FIG. 2 is a circuit diagram with three OLED segments.

In FIG. 2, which illustrates an OLED device, three of these segments of FIG. 1 are combined. This results in three segments 208, 210 and 212 which altogether make the OLED device 206. In other words, a sequence of serially electrically connected organic light emitting diode segments 208, 210 and 212 is provided.

Regarding a given segment, for example the segment 208, a neighboring segment can be defined which is the segment 210. The given segment 208 comprises a first organic light emitting diode 216 and a second organic light emitting diode 214. The first and the second organic light emitting diodes 216 and 214 have a common shared electrode 234 and first and second unshared electrodes 236 and 238, respectively.

Similarly, the neighboring segment 210 comprises a third and fourth organic light emitting diode 218 and 220, respectively. These diodes have a second common shared electrode 240 and third and fourth unshared electrodes 244 and 242, respectively. The given segment 208 is serially electrically connected to the neighboring segment 210. This connection comprises an electrical connection of the first common shared electrode 234 with the third unshared electrode 244 and an electrical connection of the second common shared electrode 240 with the first unshared electrode 236.

This results in a direct serial connection of the segments 208 and 210.

The same electrical connection principle can also be applied to the segments 210 and 212. In this case, the segment 210 can be considered as the given segment and the segment 212 can be considered as the neighboring segment. In this case, the common shared electrode 240 of the segment 210 is electrically connected to the unshared electrode 248 of the segment 212. The common shared electrode 246 of the segment 212 is electrically connected to the unshared electrode 242 of the segment 210.

Further, from FIG. 2 it becomes clear that regarding the segments 208, 210 and 212, i.e. the OLED device 206 any unshared electrode comprised in this sequence of segments is electrically connected to maximally one common shared electrode comprised in the sequence of segments.

Further shown in FIG. 2 is an AC power source 200 and external diodes 202 and 204. These external diodes are advantageously super fast rectifying diodes adapted to the voltage and current requirements for the specific device application. The OLED device in FIG. 2 is advantageously used for very high frequency AC sources, e.g. switch mode power supplies where the switching frequencies are in the range of several hundred kHz.

In case a positive voltage is applied to the OLED device 206 via the diode 202 and a negative voltage is applied to the OLED device 206 via the diode 204, the diode 202 will block this voltage. As a consequence, electrical power will only be supplied to the OLED device 206 via the connecting terminal 226. As a consequence, the lower array of OLEDs 214, 218 and 222 will be active. An electrical current will flow from the connecting terminal 226 to the connecting terminal 232 via the OLEDs 214, 218 and 222.

However, if in contrast a negative voltage is applied to the OLED device via the diode 202 and a positive voltage is applied to the OLED device via the diode 204, the diode 204 will block the voltage such that an electrical current can only flow through the OLED device via the connecting terminals 228 and 230. As a consequence, the upper array of OLEDs 216, 220 and 224 will be active.

Figure 3A:
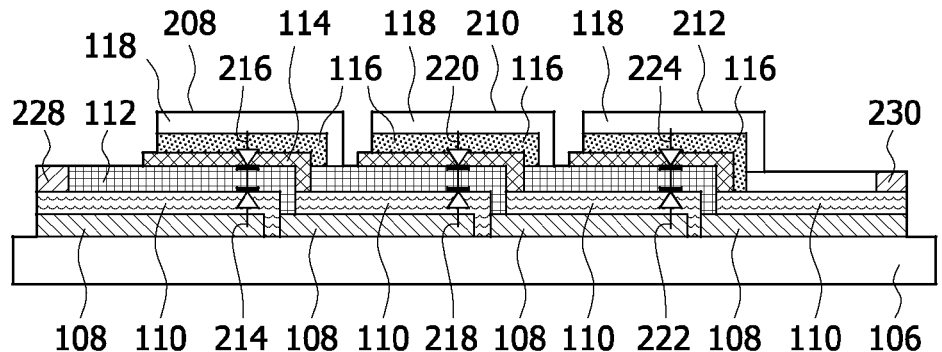
FIG. 3 is a schematic illustrating the spatial layer arrangement of the OLED device of FIG. 2.

FIG. 3 schematically illustrates the layer arrangement of the OLED device of FIG. 2. In FIG. 3a, a cross section is shown. Again, it has to be noted that the diode symbols shown in FIG. 3a are only for illustrative purposes as already discussed with respect to FIG. 1.

All segments 208, 210 and 212 comprise a common substrate 106. For each segment, individually on top of the substrate 106 an electrode 108, an emission layer 110, a common electrode 112, an emission layer 114, an electrode 116 and an optional protection layer 118 is sequentially provided in a vertically stacked manner. Important in FIG. 3a is that in order to obtain the electrical connection between the segments as illustrated in FIG. 2, the common layer 112 of the segment 208 is overlapping the electrode 108 of the segment 210. Further, the common electrode 112 is electrically contacting the electrode 108 of the segment 210. This is achieved by means of a gap of the emission layer 110.

Further, the top electrode 116 of the segment 208 is partially overlapping the common electrode 112 of the segment 210. Further, the electrode 116 of the segment 208 is electrically contacting the common electrode 112 of the segment 210. Again, for this purpose the emission layer 114 has a respective gap such that it is possible to contact the underlying common shared electrode 112 of the segment 210 by the electrode 116 of the segment 208.

This principle can be expanded further with respect to the contacting of the segments 210 and 212, as illustrated in FIG. 3.

Figure 3B:
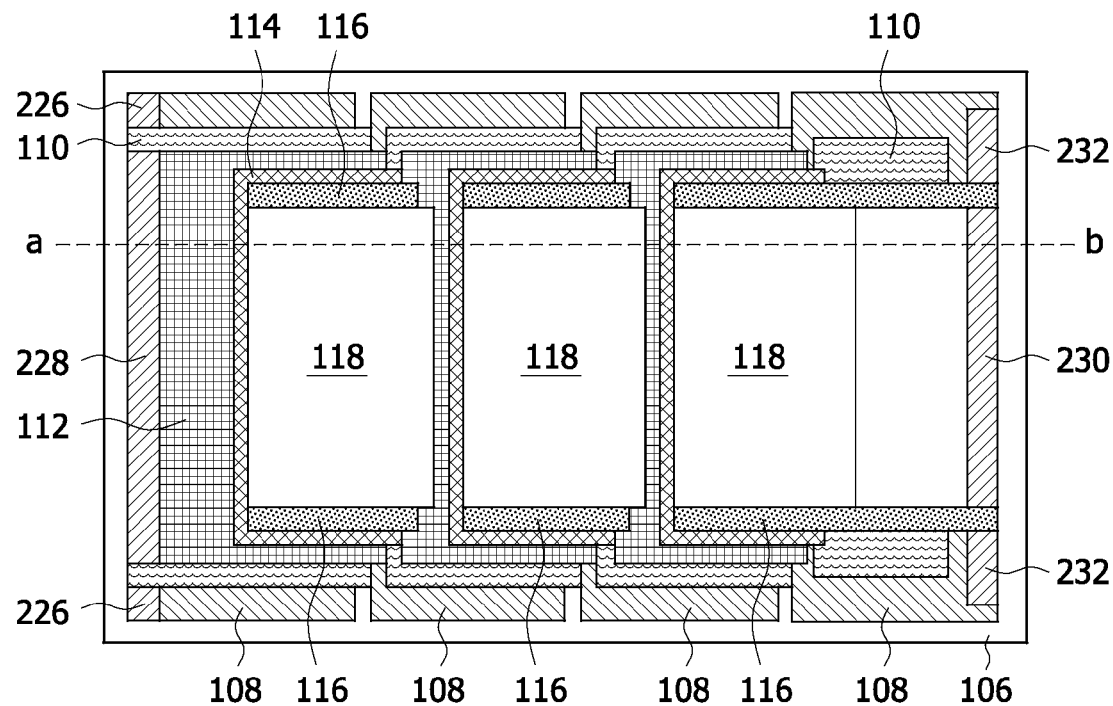

FIG. 3b is a top view of the layer arrangement, whereas FIG. 3a is a cross section through this layer arrangement along the section a, b.

As further can be seen from FIG. 3b, the connecting terminals 226, 228, 230 and 234 can also be provided to the OLED device in a layered manner.

Figure 4:
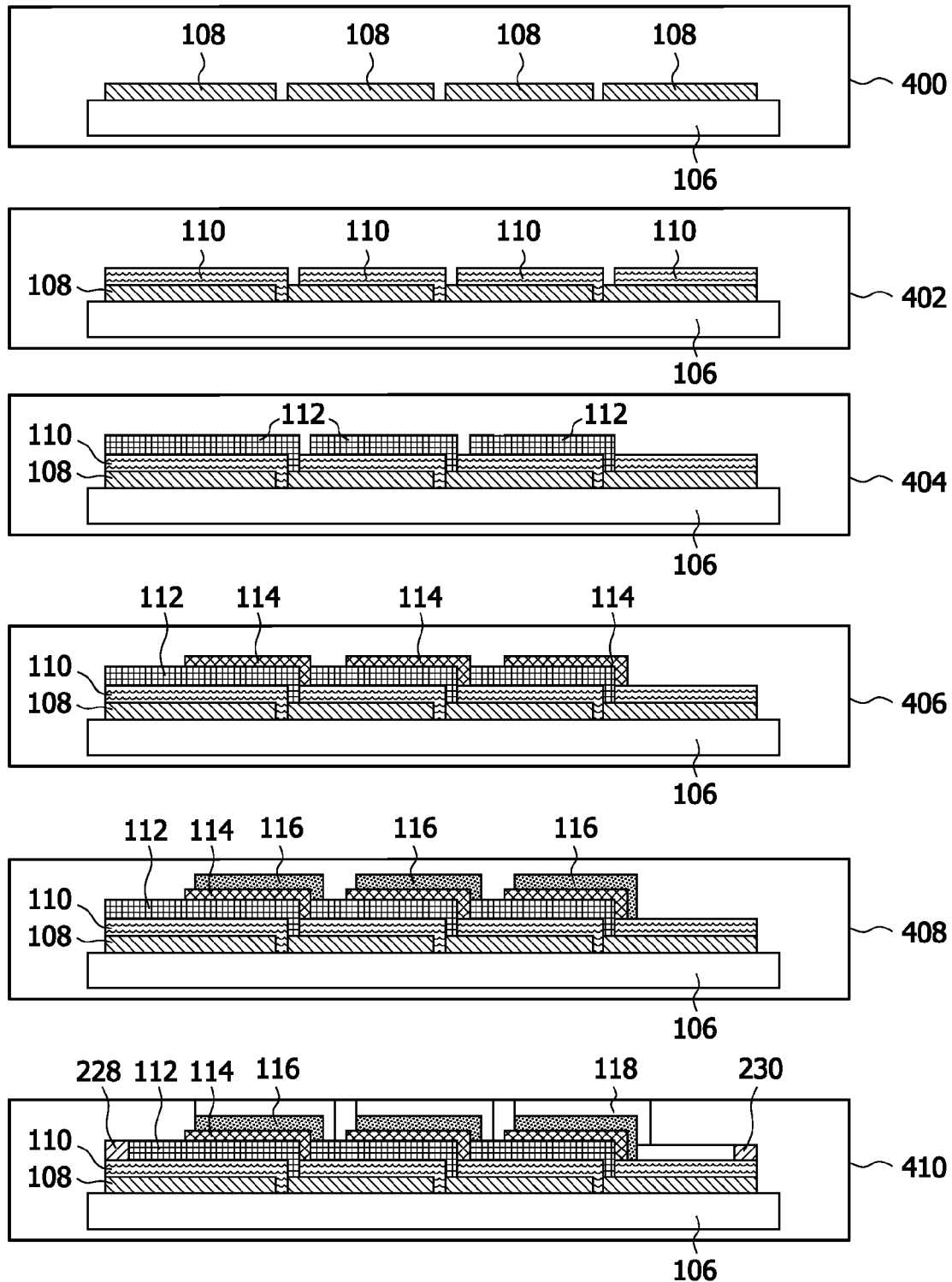
FIG. 4 illustrates various steps of producing the OLED device illustrated in FIG. 3.

An example of the processing steps required in order to produce the device in FIG. 3 is shown in FIG. 4. Given a transparent substrate, e.g. glass 106 in a first step, a first electrode layer comprising electrodes 108 for the first diodes is deposited in step 400. The material of this first electrode layer is typically a transparent conductive material such as ITO. In a next step 402, an organic stack comprising an emissive layer 110 is deposited. This is followed by step 404 in which the common shared electrode layer 112 is deposited. The deposition is performed in such a manner that a common shared electrode of a given segment is partially overlapping the bottom electrode 108 of a neighboring segment and electrically contacting this bottom electrode through the emissive layer 110.

In step 406, a second organic stack 114 is deposited. This is followed by step 408 in which a second electrode layer for the second diode is deposited. This second electrode layer 116 is deposited in such a manner that for a given segment the electrode 116 partially overlaps the common shared electrode of a neighboring segment. Again, it is important that further the electrode 116 of a given segment is electrically contacting the common shared electrode of a neighboring segment through the emission layer 114. For this purpose, the emission layer 114 preferably comprises respective gaps through which a contacting can be performed.

The final step 410 is an optional cover layer, which is especially required for non-transparent OLEDs. In this case, the cover layer is typically made reflective to improve the light out coupling to the bottom side.

The resulting OLED device requires for terminals, denoted as terminal 226, 228, 230 and 232, as shown in FIG. 2.

Again, it has to be noted that the centre layer 112, which is deposited between the emission layer 110, and the emission layer 114 serves as the common shared electrode for both stacked diodes. Preferably, the common shared electrode is the cathode and the electrodes 108 and 116 are anodes. In this case, both anode layers are typically made of transparent conductive oxides with low work functions such as ITO or ZnO. The cathode layer is preferably a metal layer with a thickness of a few nanometers to preserve transparency. In this case, the resulting OLED segment is completely transparent. Only in case a bottom emitting structure is desired, the additional cover layer can be deposited on the top anode layer to reflect the light through the transparent substrate.

The interconnect structure for a series connection of the segments manufactured with the steps illustrated in FIG. 4 can be easily integrated into a device stack. From this it becomes obvious that no additional processing steps are required to perform an interconnection of all segments. As a consequence, the method illustrated in FIG. 4 is cheap and easily performable.

Figure 5:
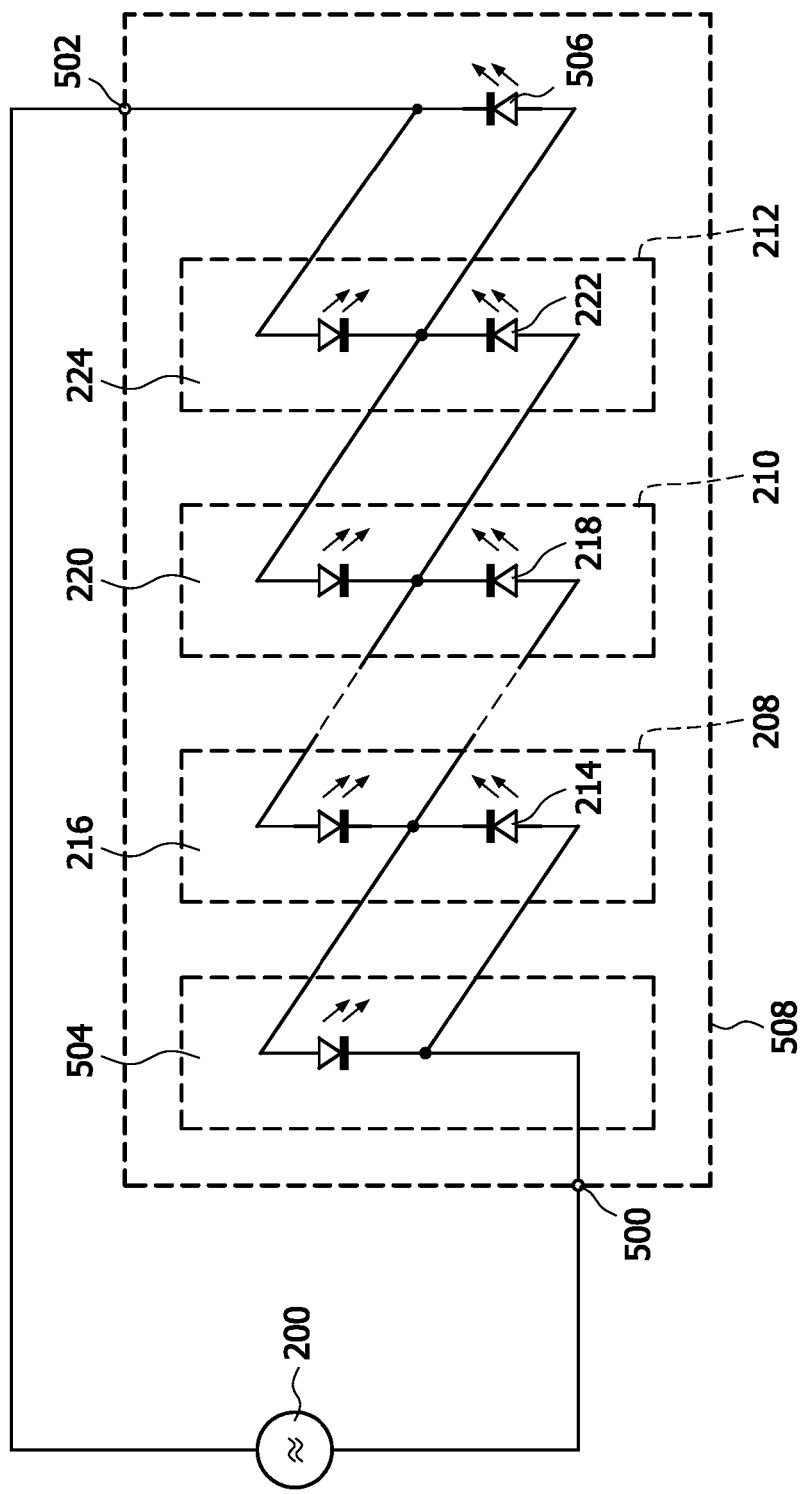
FIG. 5 is a further circuit diagram of an OLED device with only two connecting terminals.

FIG. 5 illustrates a further circuit diagram of an OLED device 508 which comprises an odd number of segments 208, 210 and 212, i.e. three segments. In contrast to FIG. 2, no additional rectifying diodes 202 and 204 but two additional OLEDs 504 and 506 are used for rectification purposes. These OLEDs 504 and 506 are also integrated in the OLED device 508, wherein such integration can be performed for example via the production method, which was illustrated with respect to FIG. 4.

Referring to FIG. 5, the sequence of segments 208, 210 and 212 comprises a first and last segment, namely the segment 208 as the first segment and the segment 212 as the last segment. Further, only two connecting terminals 500 and 502 are provided. The common shared electrode of the first segment 208 is electrically connected via the OLED 504 to the connecting terminal 500. Further, the common shared electrode of the last segment 212 is electrically connected via the OLED 506 to the connecting terminal 502. Further, the connecting terminal 500 is electrically connected to the unshared electrode of the first segment 208, which unshared electrode is unconnected to a common shared electrode. Similarly, the connecting terminal 502 is electrically connected to the unshared electrode of the last segment 212 which unshared electrode is unconnected to a common shared electrode.

It has to be noted that 'electrically connected' has to be preferably understood as immediate, direct electrical connection without interposing additional electrical components like further diodes. The additional diodes 504 and 506 are only required for directing the electrical current to the lower or upper array of OLEDs in case an AC current is provided to the OLED device 508.

Figure 6:
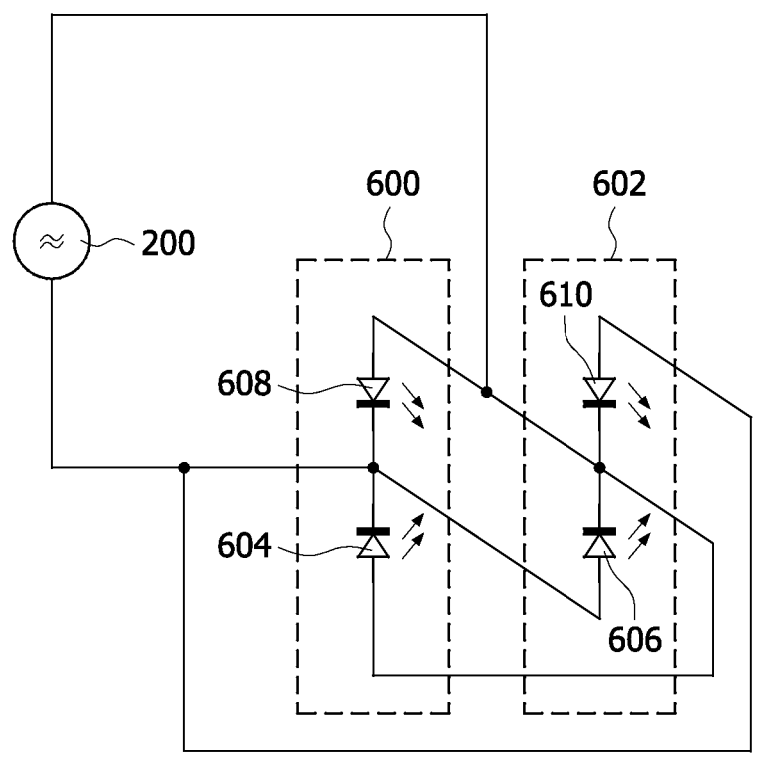
FIG. 6 illustrates the basic circuit of an OLED device.

FIG. 6 illustrates a further circuit diagram of an OLED device comprising only two segments 600 and 602. Each segment comprises two organic light emitting diodes which are vertically stacked with their conducting directions pointing in opposed directions, wherein in the stack the organic light emitting diodes are electrically connected to each other by a common shared electrode. The segments 600 and 602 thus comprise diodes 604 and 608, as well as diodes 606 and 610, respectively. The common shared electrode of the segment 600 is electrically connected to an unshared electrode of the segment 602, namely the unshared electrode of the OLED 606. Further, the common shared electrode of the segment 602 is electrically connected to an unshared electrode of the segment 600, namely the unshared electrode of the OLED 608.

Further, the power source 200 is electrically connected with one electrical pole to the common shared electrode of the second segment 602, the other electrical pole of the power source 200 is electrically connected to the common shared electrode of the segment 600 and the unshared electrode of the OLED 610 of the segment 602.

Figure 7:
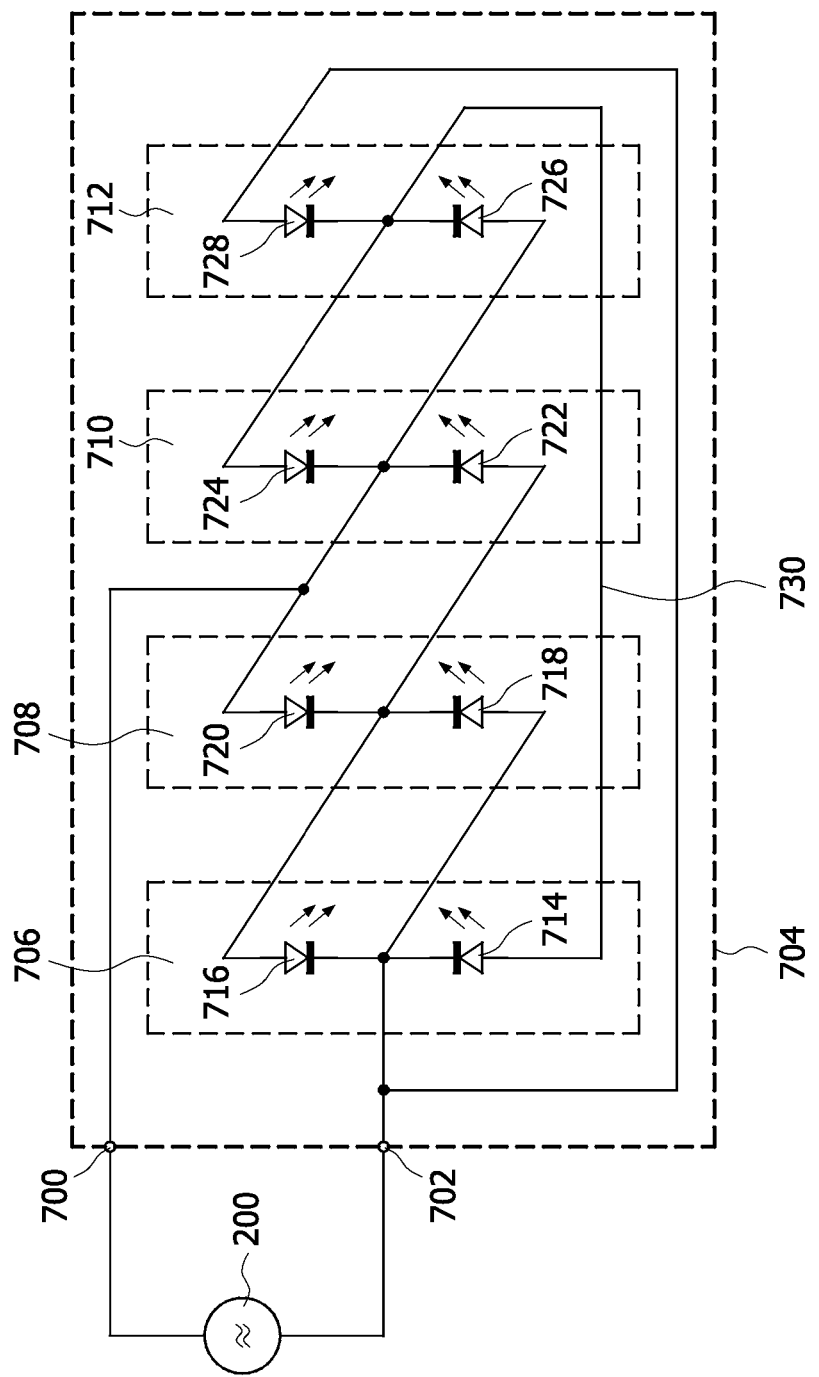
FIG. 7 is a further circuit diagram of a symmetric arrangement of OLED segments.

FIG. 7 illustrates a further circuit diagram of a further embodiment of an OLED device 704. The OLED device 704 is an AC OLED device with only two terminals 700 and 702 and an additional interconnect structure on the device substrate. The upper array of diodes 716, 720, 724 and 728 are the 'plus' diodes, conducting for positive driving currents, whereas the diodes in the bottom array, i.e. the diode 714, 718, 722 and 726 are the 'minus' diodes which conduct only during the negative cycle of the driving current.

The OLED device 704 consists of four segments 706, 708, 710 and 712, each segment comprising two organic light emitting diodes, wherein again these organic light emitting diodes are vertically stacked with their conducting directions pointing in opposed directions, wherein in the stack the organic light emitting diodes are electrically connected to each other by a common shared electrode.

The sequence of segments comprises an even number of four segments, as well as a first connecting terminal 702 and a second connecting terminal 700 for receiving electrical power for driving the device 704 for light emission. The sequence of segments comprises a first segment 706 and a last segment 712, wherein the connecting terminal 702 is electrically connected to the common shared electrode of the first segment 706 and the unshared electrode of the last segment 712, i.e. the electrode of the diode 728. This diode 728 is unconnected to a common shared electrode.

The second connecting terminal 700 is electrically connected to the common shared electrode of the n/2+1th segment, i.e. the third segment 710 of the sequence of segments.

Figure 8A:
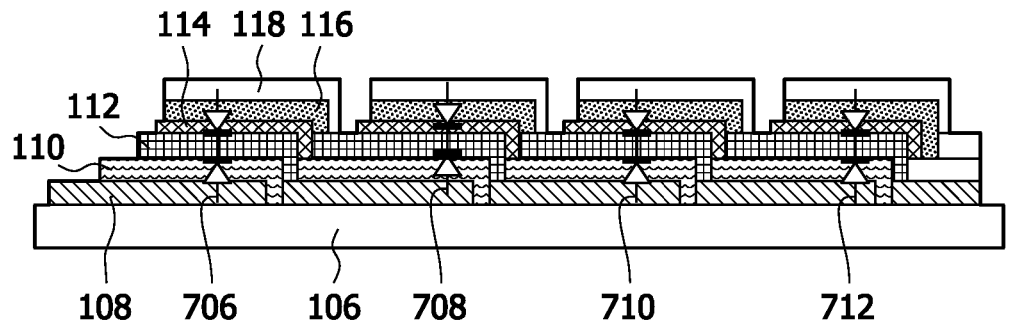
FIG. 8 illustrates the spatial layer arrangement of the device of FIG. 7.
Figure 8B:
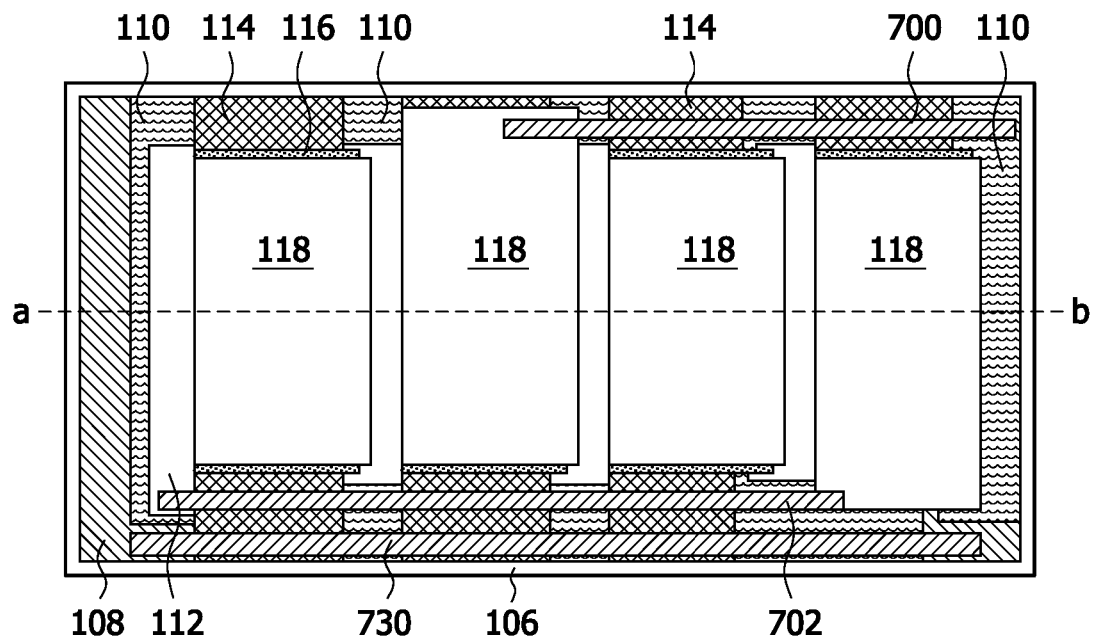

FIG. 8 shows the layer arrangement in a cross section (FIG. 8a) and a top view (FIG. 8b), wherein FIG. 8a is a cross section through the section a, b of FIG. 8b. Again, the diodes drawn in FIG. 8a are only for illustrative purposes, as already discussed with respect to FIGS. 1 and 3a.

FIGS. 8a and 8b basically correspond to the FIGS. 3a and 3b, aside from the fact that in FIG. 8 four segments are used, whereas in FIG. 3 only three segments have been used.

A further difference between FIG. 8b and FIG. 3b is the way, the terminals are connected to the respective segments: in FIG. 7 additionally the unshared electrode of the OLED 714 of the first segment 706 is electrically connected to the common shared electrode of the segment 712 via an electrical connection 730. This electrical connection 730 is clearly visible in the top view in FIG. 8b. The electrical connection 730 connects the bottom anode 108 of the first segment 706 (OLED 714) with the common shared electrode of the last segment 712.

LIST OF REFERENCE NUMERALS

100 Segment
102 OLED
104 OLED

106 Substrate
108 Electrode
110 Emission layer
112 Electrode
114 Emission layer
116 Electrode
118 Cover layer
120 Diode illustration
200 Power source
202 Diode
204 Diode
206 OLED device
208 Segment
210 Segment
212 Segment
214 OLED
216 OLED
218 OLED
220 OLED
222 OLED
224 OLED
226 Connecting terminal
228 Connecting terminal
230 Connecting terminal
232 Connecting terminal
234 Common shared electrode
236 Unshared electrode
238 Unshared electrode
240 Common shared electrode
242 Unshared electrode
244 Unshared electrode
246 Common shared electrode
248 Unshared electrode
500 Connecting terminal
502 Connecting terminal
504 OLED
506 OLED
508 OLED device
600 Segment
602 Segment
604 OLED
606 OLED
608 OLED
610 OLED
700 Connecting terminal
702 Connecting terminal
704 OLED device
706 Segment
708 Segment
710 Segment
712 Segment
714 OLED
716 OLED
718 OLED
720 OLED
722 OLED
724 OLED
726 OLDE
728 OLED
730 electrical connections

The invention claimed is:

1. An organic light emitting diode device comprising a sequence of serially electrically connected organic light emitting diode segments, the organic light emitting diode segment comprising two organic light emitting diodes, wherein the organic light emitting diodes are vertically stacked with their conducting directions pointing in opposed directions, wherein in the stack the organic light emitting diodes are electrically connected to each other by a common shared electrode, wherein the organic light emitting diode device comprising a sequence of serially electrically connected organic light emitting diode segments, wherein the sequence of segments comprises a given segment and a neighbouring segment, wherein the given segment comprises a first and second organic light emitting diode with a first common shared electrode and first and second unshared electrodes, wherein the neighbouring segment comprises a third and fourth organic light emitting diode with a second common shared electrode and third and fourth unshared electrodes, wherein the given segment is serially electrically connected to the neighbouring segment by an electrical connection of the first common shared electrode with the third unshared electrode and by an electrical connection of the second common shared electrode with the first unshared electrode, wherein any unshared electrode comprised in the sequence of segments is electrically connected to maximally one common shared electrode comprised in the sequence of segments.

2. The segment of claim 1, wherein the common shared electrode is the cathode.

3. The segment of claim 1, wherein the two organic light emitting diodes are adapted for light emission in a respective first and second wavelength range, wherein the common shared electrode is optically transparent in at least said first or second wavelength range.

4. The segment of claim 3, herein the first wavelength range is different from the second wavelength range.

5. The device according to claim 1, wherein the sequence of segments comprises an even number of n segments and a first and a second connecting terminal for receiving electrical power for driving the device for light emission, wherein the sequence of segments comprises a first and a last segment, wherein the first connecting terminal is electrically connected to the common shared electrode of the first segment and the unshared electrode of the last segment which is unconnected to a common shared electrode, wherein the second connecting terminal is electrically connected to a common shared electrode of any segment of the sequence of the segments.

6. The device according to claim 5, wherein said second connecting terminal is electrically connected to the common shared electrode of the n/2+1 segment of the sequence of segments.

7. The device according to claim 1, wherein the sequence of segments comprises an odd number of segments and a first, second, third and fourth connecting terminal for receiving electrical power for driving the device for light emission, wherein the sequence of segments comprises a first and a last segment, wherein the first connecting terminal is electrically connected to the common shared electrode of the first segment and the second connecting terminal is electrically connected to the unshared electrode of the first segment which is unconnected to a common shared electrode, wherein the third connecting terminal is electrically connected to the common shared electrode of the last segment and the fourth connecting terminal is electrically connected to the unshared electrode of the last segment which is unconnected to a common shared electrode.

8. The device according to claim 7, wherein the common shared electrode of the first segment is electrically connected via a diode to the first connecting terminal and/or the common shared electrode of the last segment is electrically connected via a further diode to the third connecting terminal.

9. The device according to claim 7, wherein the first and second terminals are identical.

10. A method of producing an organic light emitting diode device, the method comprising:

providing a first layer comprising a first given unshared electrode segment, depositing a first emitter layer on the first layer, depositing a second layer comprising a given common shared electrode segment on the first emitter layer, depositing a second emitter layer on the second layer, depositing a third layer comprising a second given unshared electrode segment on the second emitter layer, wherein the first given unshared electrode segment, the first emitter layer and the given common shared electrode segment form a first organic light emitting diode and wherein the given common shared electrode segment, the second emitter layer and the second given unshared electrode segment form a second organic light emitting diode, wherein the first and second organic light emitting diodes are vertically stacked with their conducting directions pointing in opposed directions, wherein for producing an organic light emitting diode device comprising a sequence of serially electrically connected organic light emitting diode segments with the sequence of segments comprising a given segment and a neighbouring segment, the first lay er further comprises a first neighbouring unshared electrode segment, the first emitter layer comprises a first gap, the second layer further comprises a neighbouring unshared electrode segment, wherein the deposition of the second layer is performed for electrically contacting the first neighbouring unshared electrode segment by the given common shared electrode segment via the first gap, the second emitter layer comprises a second gap, the third layer further comprises a second neighbouring unshared electrode segment, wherein the deposition of the third layer is performed for electrically contacting the neighbouring common shared electrode segment by the second given unshared electrode segment via the first gap, wherein the first given unshared electrode segment, the first emitter layer, the given common shared electrode segment, the second emitter layer and the second given unshared electrode segment form the given organic light emitting diode segment and wherein the first neighbouring unshared electrode segment, the first emitter layer, the neighbouring common shared electrode segment, the second emitter layer and the second neighbouring unshared electrode segment form the neighbouring organic light emitting diode segment.

11. The device according to claim 7, wherein the third and fourth terminals are identical.

* * * * *